(12) United States Patent
Chen et al.

(10) Patent No.: US 11,064,622 B2
(45) Date of Patent: Jul. 13, 2021

(54) DISPLAY SCREEN AND DISPLAY APPARATUS

(71) Applicants: Hefei BOE Optoelectronics Technology Co., Ltd., Anhui (CN); BOE Technology Group Co., Ltd., Beijing (CN)

(72) Inventors: Tong Chen, Beijing (CN); Linfei Shao, Beijing (CN); Wangbao Xie, Beijing (CN); Xiaoming Meng, Beijing (CN)

(73) Assignees: HEFEI BOE OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 43 days.

(21) Appl. No.: 16/567,316

(22) Filed: Sep. 11, 2019

(65) Prior Publication Data
US 2020/0084904 A1 Mar. 12, 2020

(30) Foreign Application Priority Data
Sep. 11, 2018 (CN) .......................... 201811058764.0

(51) Int. Cl.
| | | |
|---|---|---|
| *H05K 1/09* | (2006.01) |
| *H05K 1/11* | (2006.01) |
| *H05K 1/18* | (2006.01) |
| *H05K 3/36* | (2006.01) |
| *H05K 5/02* | (2006.01) |
| *G02F 1/1333* | (2006.01) |
| *G02F 1/1362* | (2006.01) |
| *G06F 1/16* | (2006.01) |
| *H05K 7/04* | (2006.01) |
| *H05K 1/02* | (2006.01) |
| *H01R 12/51* | (2011.01) |
| *H05K 5/00* | (2006.01) |
| *H05K 1/14* | (2006.01) |
| *H01R 4/04* | (2006.01) |

(52) U.S. Cl.
CPC ............... *H05K 7/04* (2013.01); *H01R 12/51* (2013.01); *H05K 1/0215* (2013.01); *H05K 1/147* (2013.01); *H05K 5/0017* (2013.01); *H01R 4/04* (2013.01); *H05K 2201/10128* (2013.01); *H05K 2201/10189* (2013.01)

(58) Field of Classification Search
CPC ... H05K 1/09; H05K 1/11; H05K 1/18; H05K 3/36; H05K 5/02; G02F 1/1333; G02F 1/1362; G06F 1/16
USPC ............... 361/749, 679.01, 679.08; 362/606; 174/94 R; 345/1.2, 87, 173; 349/58, 65, 349/150; 257/40; 1/1
See application file for complete search history.

(56) References Cited

U.S. PATENT DOCUMENTS 5,001,302 A * 3/1991 Atsumi ..................... H01R 4/04
174/94 R
5,038,251 A * 8/1991 Sugiyama ........... H01L 23/5388
235/61 R
5,311,341 A * 5/1994 Hirai .................... G02F 1/13452
257/E23.065

(Continued)

*Primary Examiner* — Xiaoliang Chen
(74) *Attorney, Agent, or Firm* — Fay Sharpe LLP

(57) ABSTRACT

The present disclosure provides a display screen and a display apparatus, pertaining to the field of display technologies. The display screen includes: a backplane, a printed circuit board and a fixing adhesive, wherein the printed circuit board is fixed to the backplane by the fixing adhesive.

19 Claims, 9 Drawing Sheets

(56) References Cited

U.S. PATENT DOCUMENTS

| | | | | |
|---|---|---|---|---|
| 5,652,608 | A * | 7/1997 | Watanabe | B41J 2/14024 347/50 |
| 5,760,797 | A * | 6/1998 | Koizumi | B41J 2/04541 347/14 |
| 6,226,175 | B1 * | 5/2001 | Murayama | G06F 1/1616 235/145 R |
| 6,380,681 | B1 * | 4/2002 | Matsuda | H01L 25/167 315/3 |
| 6,445,429 | B1 * | 9/2002 | Moster | G02F 1/133308 345/905 |
| 10,332,859 | B2 * | 6/2019 | Nakamura | H01L 24/32 |
| 10,332,915 | B2 * | 6/2019 | Fukuda | H01L 27/124 |
| 10,485,101 | B2 * | 11/2019 | Eom | H05K 5/0017 |
| 2002/0180923 | A1 * | 12/2002 | Aoyagi | H05K 1/0274 349/149 |
| 2004/0106306 | A1 * | 6/2004 | Miyamura | H01R 12/62 439/67 |
| 2007/0063939 | A1 * | 3/2007 | Bellamy | G02F 1/13452 345/87 |
| 2008/0055833 | A1 * | 3/2008 | Hori | H01J 11/44 361/679.01 |
| 2008/0165063 | A1 * | 7/2008 | Schlub | H01Q 1/243 343/702 |
| 2011/0000305 | A1 * | 1/2011 | Lin | G06F 3/0338 73/760 |
| 2013/0044511 | A1 * | 2/2013 | Motooka | G02B 6/0055 362/606 |
| 2013/0341597 | A1 * | 12/2013 | Kim | H01L 27/3276 257/40 |
| 2014/0063415 | A1 * | 3/2014 | Oohira | G02B 6/0083 349/65 |
| 2015/0029436 | A1 * | 1/2015 | Nakayama | H05K 1/189 349/58 |
| 2015/0054762 | A1 * | 2/2015 | Lin | G06F 3/03547 345/173 |
| 2015/0277496 | A1 * | 10/2015 | Reeves | G06F 3/1438 345/1.2 |
| 2016/0147361 | A1 * | 5/2016 | Ahn | G06F 3/0416 345/173 |
| 2017/0123524 | A1 * | 5/2017 | Arola | G06F 3/0412 |
| 2017/0135209 | A1 * | 5/2017 | Kim | H05K 1/09 |
| 2017/0261803 | A1 * | 9/2017 | Teramoto | G02F 1/133345 |
| 2017/0371194 | A1 * | 12/2017 | Tomioka | H01L 27/124 |
| 2017/0371195 | A1 * | 12/2017 | Tomioka | H01L 51/5234 |
| 2018/0151539 | A1 * | 5/2018 | Nakamura | H01L 27/3293 |
| 2018/0308490 | A1 * | 10/2018 | Lim | G10L 15/18 |
| 2019/0051593 | A1 * | 2/2019 | Kimura | H01L 27/1218 |
| 2019/0067406 | A1 * | 2/2019 | Lee | H01L 27/3262 |
| 2019/0271892 | A1 * | 9/2019 | Zhu | G02F 1/13452 |

* cited by examiner

US 11,064,622 B2

DISPLAY SCREEN AND DISPLAY APPARATUS

This application claims priority to Chinese Patent Application No. 201811058764.0, filed on Sep. 11, 2018 and entitled "DISPLAY SCREEN AND DISPLAY APPARATUS", the entire contents of which are incorporated herein by reference.

TECHNICAL FIELD

The present disclosure relates to the field of display technologies, and particularly to a display screen and a display apparatus.

BACKGROUND

With the development of display technologies, display apparatuses are more and more applied in people's daily life, for example, televisions, mobile phones, laptop computers or the like.

A display screen in a display apparatus includes: a backplane, a printed circuit board (PCB), electronic devices and screws. The printed circuit board is superimposed on the backplane, and the backplane and the printed circuit board are both provided with screw holes. The screws pass through the screw holes in the printed circuit board and in the backplane in sequence, such that the printed circuit board is fixed to the backplane. In this case, screw caps of the screws are on a side of the printed circuit board away from the backplane.

SUMMARY

The present disclosure provides a display screen and a display apparatus. The technical solutions are as follows.

In an aspect, there is provided a display screen, comprising: a backplane, a printed circuit board and a fixing adhesive, wherein the printed circuit board is fixed to the backplane by the fixing adhesive.

Optionally, the fixing adhesive comprises: a conductive adhesive.

Optionally, the display screen further comprises: an electronic device; wherein the fixing adhesive and the electronic device are both on a surface on the printed circuit board close to the backplane, and in a thicknesswise direction of the printed circuit board, a sum of a thickness of a portion of the backplane in contact with the fixing adhesive and a thickness of the fixing adhesive is less than a maximum thickness of the electronic device.

Optionally, the display screen further comprises: a wrap structure and a double-faced adhesive; wherein the wrap structure wraps the printed circuit board and the backplane, and the printed circuit board is fixed to the wrap structure by the double-faced adhesive.

Optionally, in a thicknesswise direction of the printed circuit board, a thickness of the double-faced adhesive is less than 0.2 mm.

Optionally, in the thicknesswise direction of the printed circuit board, the thickness of the double-faced adhesive is 0.03 mm.

Optionally, the display screen further comprises: a display panel and a flexible circuit board; wherein the display panel and the printed circuit board are on a same side of the backplane, and the flexible circuit board is between the printed circuit board and the double-faced adhesive; and one end of the flexible printed circuit is electrically connected to the electronic device by the printed circuit board, and the other end of the flexible printed circuit is electrically connected to the display panel.

Optionally, a first adhesive face of the double-faced adhesive is in contact with an auxiliary surface of the printed circuit board away from the backplane; wherein an orthographic projection of a first edge of the first adhesive face on a plane of the auxiliary surface is within the auxiliary surface, and a distance between the first edge and a second edge of the auxiliary surface is greater than 0, wherein the first edge is any edge of the first adhesive face, and the second edge is close to the first edge.

Optionally, the display screen further comprises: a display panel and a flexible printed circuit; wherein the display panel and the printed circuit board are on a same side of the backplane, the flexible printed circuit and the double-faced adhesive are on a same surface of the printed circuit board, and a gap exists between an orthographic projection of the flexible printed circuit on the printed circuit board and an orthographic projection of the double-faced adhesive on the printed circuit board; and one end of the flexible printed circuit is electrically connected to the electronic device by the printed circuit board, and the other end of the flexible printed circuit is electrically connected to the display panel.

Optionally, a first adhesive face of the double-faced adhesive is in contact with an auxiliary surface of the printed circuit board away from the backplane; a gap exists between the double-faced adhesive and the flexible printed circuit; wherein an orthographic projection of a third edge of the first adhesive face on a plane of the auxiliary surface is within the auxiliary surface, and a distance between the third edge and a fourth edge of the auxiliary surface is greater than 0; wherein the third edge is any edge of the first adhesive face away from the flexible printed circuit, and the fourth edge is close to the third edge.

Optionally, the display screen further comprises: an abutting block and an adhesive; wherein the electronic device comprises a connector; wherein the abutting block is fixed to a surface of the printed circuit board close to the backplane, and the abutting block and the connector are on a same side of the printed circuit board and are arranged in sequence along a direction away from the backplane, one end the abutting block away from the connector is abutted against the backplane, and the abutting block is insulated from the connector.

Optionally, in a thicknesswise direction of the printed circuit board, a sum of a thickness of the abutting block and a thickness of the adhesive is less than a maximum thickness of the connector.

Optionally, the abutting block and the connector are oppositely arranged in one-to-one correspondence in the display screen.

Optionally, the backplane comprises: a backplane body, and a support bar extending from a side face of the backplane body towards the printed circuit board, the printed circuit board is fixed to the support bar by the adhesive, and one end of the abutting block away from the connector is abutted against the backplane body.

Optionally, the backplane comprises a plurality of the support bars, and the abutting block is between the plurality of the support bars.

Optionally, a target portion of the wrap structure on a side of the printed circuit board facing towards the backplane has a transparent region, and an orthographic projection of an abutting position between the backplane and the abutting block on the target portion is within the transparent region.

Optionally, the wrap structure and the abutting block are an integral structure.

Optionally, in a thicknesswise direction of the printed circuit board, a thickness of a side, where the printed circuit board is, of the display screen is 1.99 mm.

Optionally, the fixing adhesive comprises: a conductive adhesive; the display screen further comprises: a wrap structure and a double-faced adhesive; wherein the wrap structure wraps the printed circuit board and the backplane, and the printed circuit board is fixed to the wrap structure by the double-faced adhesive; in a thicknesswise direction of the printed circuit board, a thickness of the double-faced adhesive is 0.03 mm; the display screen further comprises: an abutting block and an adhesive, and the electronic device comprises a connector; wherein the abutting block is fixed to a surface of the printed circuit board close to the backplane, and the abutting block and the connector are on a same side of the printed circuit board and are arranged in sequence along a direction away from the backplane, one end of the abutting block away from the connector is abutted against the backplane, and the abutting block is insulated from the electronic device; in the thicknesswise direction of the printed circuit board, a sum of a thickness of the abutting block and a thickness of the adhesive is less than a maximum thickness of the connector; the abutting block and the connector are oppositely arranged in one-to-one correspondence in the display screen; the backplane comprises: a backplane body, and a support bar extending from a side face of the backplane body towards the printed circuit board, the printed circuit board is fixed to the support bar by the adhesive, and one end of the abutting block away from the connector is abutted against the backplane body; the backplane comprises a plurality of the support bars, and the abutting block is between the plurality of the support bars; a target portion of the wrap structure on a side of the printed circuit board facing towards the backplane has a transparent region, and an orthographic projection of an abutting position between the backplane and the abutting block on the target portion is within the transparent region; the wrap structure and the abutting block are an integral structure; in the thicknesswise direction of the printed circuit board, a thickness of a side, where the printed circuit board is, of the display screen is 1.99 mm; the display screen satisfies one of the following conditions: the display screen further comprises: a flexible printed circuit between the printed circuit board and the double-faced adhesive; wherein one end of the flexible printed circuit is electrically connected to the electronic device by the printed circuit board, and the other end of the flexible printed circuit is electrically connected to a display panel in the display screen; a first adhesive face of the double-faced adhesive is in contact with an auxiliary surface of the printed circuit board away from the backplane; wherein an orthographic projection of a first edge of the first adhesive face on a plane of the auxiliary surface is within the auxiliary surface, and a distance between the first edge and a second edge of the auxiliary surface is greater than 0, wherein the first edge is any edge of the first adhesive face, and the second edge is close to the first edge; the display screen further comprises: a flexible printed circuit on a same side of the printed circuit board as the double-faced adhesive; and one end of the flexible printed circuit is electrically connected to the electronic device by the printed circuit board, and the other end of the flexible printed circuit is electrically connected to a display panel in the display screen; a first adhesive face of the double-faced adhesive is in contact with an auxiliary surface of the printed circuit board away from the backplane; a gas exits between the double-faced adhesive and the flexible printed circuit; wherein an orthographic projection of a third edge of the first adhesive face on a plane of the auxiliary surface is within the auxiliary surface, and a distance between the third edge and a fourth edge of the auxiliary surface is greater than 0, wherein the third edge is any edge of the first adhesive face away from the flexible printed circuit, and the fourth edge is close to the third edge.

In another aspect, there is provided a display apparatus, comprising any one of the display screens described above.

DETAILED DESCRIPTION

Figure 1:
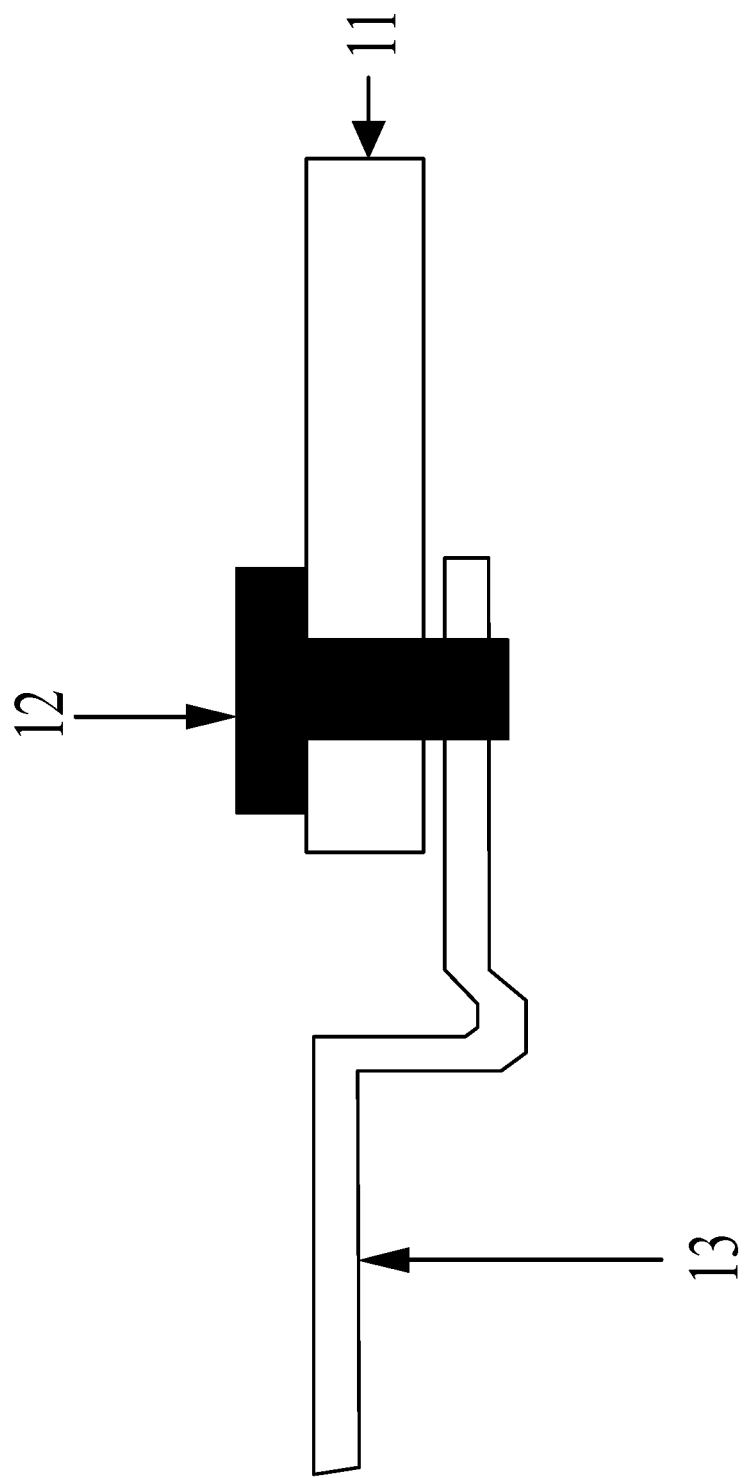
FIG. 1 is a schematic partial structural diagram of a display screen in the related art.

The embodiments of the present disclosure will be described in detail below with reference to the accompanying drawings to present the objects, technical solutions and advantages more clearly FIG. 1 is a schematic partial structural diagram of a display screen in the related art. As illustrated in FIG. 1, a printed circuit board 11 is connected to a backplane 13 by a screw 12. Thus, the connection between the printed circuit board 11 and the backplane 13 in the related art lacks diversity. Therefore, the embodiment of the present disclosure provides another way of connecting the printed circuit board and the backplane.

Figure 2:
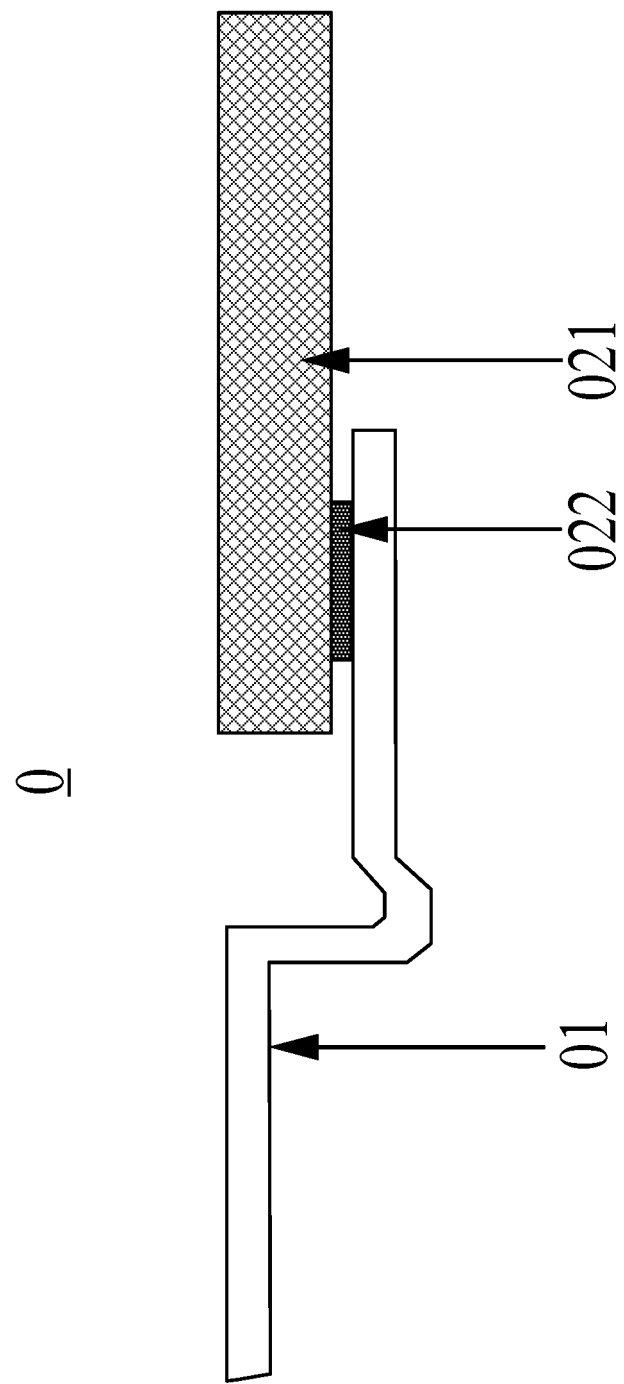
FIG. 2 is a schematic partial sectional diagram of a display screen according to an embodiment of the present disclosure.

FIG. 2 is a schematic partial structural diagram of a display screen according to an embodiment of the present disclosure. As illustrated in FIG. 2, a display screen 0 may include: a backplane 01, a printed circuit board 021 and a fixing adhesive 022. The printed circuit board 021 may be fixed to the backplane 01 by the fixing adhesive 022. Optionally, the printed circuit board 021 and the fixing adhesive 022 may be a circuit module (not illustrated in FIG. 2) in the display screen.

In summary, the display screen according to the embodiment of the present disclosure includes the fixing adhesive, and the printed circuit board may be fixed to the backplane by the fixing adhesive. That is, the embodiment of the present disclosure provides diversified connections between the printed circuit board and the backplane.

In addition, in the embodiment of the present disclosure, the screw in the related art is replaced by the fixing adhesive, and the thickness of the fixing adhesive is generally less than the thickness of the screw cap, such that the side, where the fixing adhesive and the printed circuit board are, of the display screen is thinner. Therefore, the display screen according to the embodiment of the present disclosure may be thinner.

Figure 3:
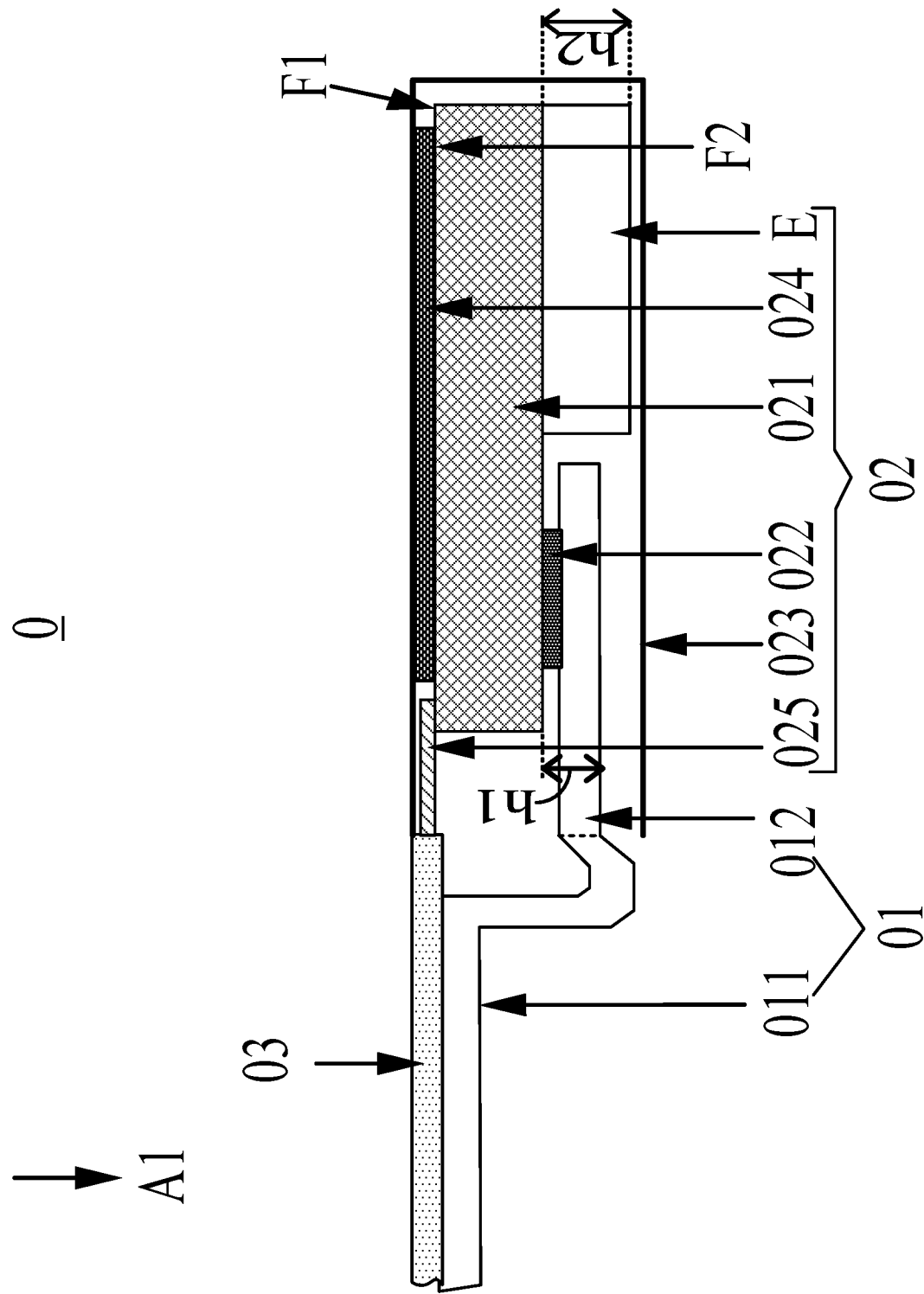
FIG. 3 is a schematic partial sectional diagram of another display screen according to an embodiment of the present disclosure.

Optionally, FIG. 3 is a schematic partial sectional diagram of another display screen according to an embodiment of the present disclosure. As illustrated in FIG. 3, based on FIG. 2, the display screen 0 may further include an electronic device E (the electronic device may also pertain to the circuit module 02 in the display screen). The fixing adhesive 022 and the electronic device E are both on a surface of the printed circuit board 021 close to the backplane 01. In addition, in a thicknesswise direction A1 of the printed circuit board 021, a sum h1 of a thickness of a portion in the backplane 01 in contact with the fixing adhesive 022 and a thickness of the fixing adhesive 022 is less than a maximum thickness h2 of the electronic device. Exemplarily, the backplane 01 may include: a backplane body 011, and a support bar 012 extending from a side face of the backplane body 011 towards the printed circuit board 021, wherein the portion in the backplane 01 in contact with the fixing adhesive 022 may be the support bar 012. It should be noted that the backplane body 011 may have a plurality of faces, wherein the plurality of faces include: two relatively larger opposite faces, and a plurality of side faces configured to connect these two opposite faces. The support bar 012 may extend from any side face of the plurality of side faces towards the printed circuit board 021.

Optionally, the backplane 01 may have two support bars 012. In addition, the two support bars 012 may be at two ends of the printed circuit board 021 and configured to support the printed circuit board 021 at the two ends.

In the embodiment of the present disclosure, the sum h1 of the thickness of the portion in the backplane 01 in contact with the fixing adhesive 022 and the thickness of the fixing adhesive 022 is less than the maximum thickness h2 of the electronic device. Therefore, the fixing adhesive 022 may not cause any impact to the thickness of the circuit module 02, such that the thickness of the circuit module 02 may be smaller, and thus the entire display screen may be thinner.

Optionally, the fixing adhesive 022 may include a conductive adhesive. The backplane 01 in the display screen 0 may be grounded. Since the printed circuit board 021 also needs to be grounded, when the fixing adhesive 022 includes the conductive adhesive, the printed circuit board 021 may be conducted with the backplane 01, such that the printed circuit board 021 is grounded. Nevertheless, the fixing adhesive 022 may not include the conductive adhesive. For example, the fixing adhesive 022 includes an insulating adhesive. In this case, the printed circuit board 021 and the backplane 01 may be electrically connected to each other by a conductive wire, which is not limited in the embodiment of the present disclosure.

Optionally, as illustrated in FIG. 3, the display screen may further include: a wrap structure 023 and a double-faced adhesive 024 (which may both pertain to the circuit module 02). The wrap structure 023 wraps the printed circuit board 021 and the backplane 01. Optionally, the wrap structure 023 may wrap the other portions (for example, the printed circuit board 021, the fixing adhesive 022, the double-faced adhesive 024, the electronic device E and the like) in the circuit module 02 except the wrap structure 023. The wrap structure 023 may be configured to prevent the other portions except the wrap structure 023 in the circuit module 02 from interference by the elements outside the circuit module 02, such that the circuit module 02 may normally operate.

It should be noted that the double-faced adhesive 024 may be attached to a surface of the printed circuit board 021 away from the backplane 01, and the printed circuit board 021 is fixed to the wrap structure 023 by the double-faced adhesive 024. Optionally, in the thicknesswise direction A1 of the printed circuit board 021, a thickness of the double-faced adhesive is less than 0.2 mm. The double-faced adhesive 024 may fix the printed circuit board 021 to the wrap structure 023, to further fix the printed circuit board 021. Still, since the thickness of the screw cap of the screw in the related art is greater than or equal to 0.2 mm whereas the thickness of the double-faced adhesive 024 according to the embodiment of the present disclosure is less than 0.2 mm, the double-faced adhesive according to the embodiment of the present disclosure has a smaller thickness over that of the screw cap in the related art. As such, the thickness of the circuit module 02 according to the embodiment of the present disclosure is smaller, and thus the display screen 0 where the circuit module is disposed may be thinner. Exemplarily, the thickness of the double-faced adhesive 024 may be 0.03 mm. Optionally, the thickness of the double-faced adhesive 024 may also another values, for example, 0.4 mm, 0.5 mm or the like, which is not limited in the embodiment of the present disclosure.

Further, still referring to FIG. 3, the display screen 0 may further include a display panel 03, wherein the display panel 03 and the printed circuit board may be disposed at a same side of the backplane 01. The circuit module 02 may further include a flexible printed circuit (FPC) 025. The flexible printed circuit 025 and the double-faced adhesive 024 may be disposed in parallel on the printed circuit board 021. In this case, the flexible printed circuit 025 and the double-faced adhesive 024 may be on a same surface of the printed circuit board 021, and a gap exists between an orthographic projection of the flexible printed circuit 025 on the printed circuit board 021 and an orthographic projection of the double-faced adhesive 024 on the printed circuit board 021. One end of the flexible printed circuit 025 is electrically connected to the electronic device E by the printed circuit board 021, and the other end of the flexible printed circuit 025 is electrically connected to the display panel 03.

Figure 4:
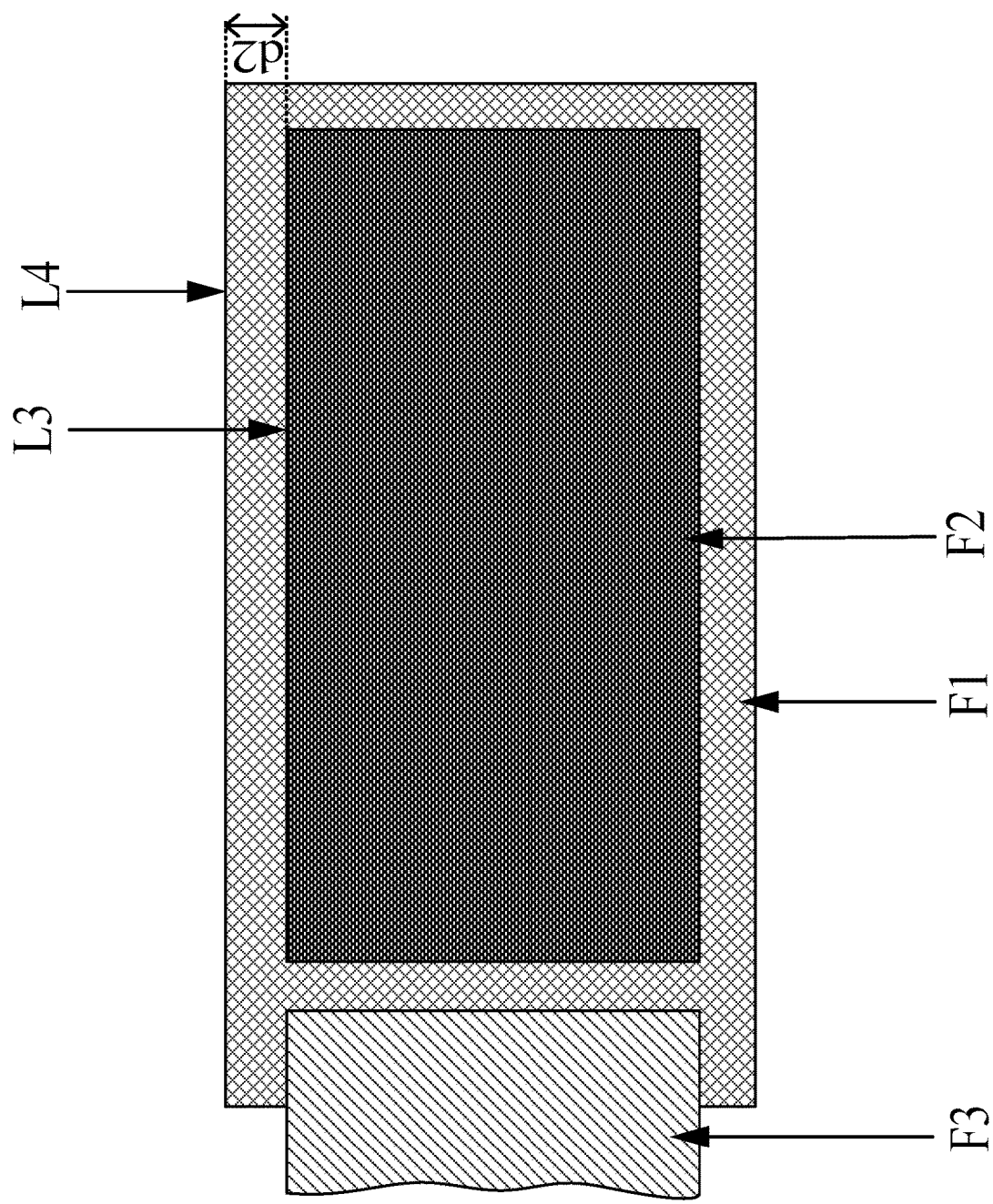
FIG. 4 is a schematic diagram of a relative relationship between an auxiliary surface, a first adhesive face and a surface of a flexible printed circuit away from a printed circuit board according to an embodiment of the present disclosure.

Optionally, a first adhesive face F2 of the double-faced adhesive 024 is in contact an auxiliary face F1 of the printed circuit board 021 away from the backplane 01, and when the double-faced adhesive 024 and the flexible printed circuit 025 are disposed in parallel on the printed circuit board 021, a gap exists between the double-faced adhesive 024 and the flexible printed circuit 025. For clear descriptions of the relationship between the first adhesive face F2 and the auxiliary surface F1, an embodiment of the present disclosure provides a schematic diagram illustrating a relative position relationship between the auxiliary surface F1, the first adhesive face F2 and a surface F3 of the flexible printed circuit away from the printed circuit board as illustrated in FIG. 4. As illustrated in FIG. 4, an orthographic projection of a third edge L3 of the first adhesive face F1 of the double-faced adhesive on a plane of the auxiliary surface F1 is within the auxiliary surface F1, and a distance d2 between the third edge L3 and a fourth edge L4 of the auxiliary surface F4 is greater than 0. The third edge L3 is any edge (that is, any edge of the first adhesive face F2 away from the flexible printed circuit) of the first adhesive face F2 which does not face towards the flexible printed circuit, and the fourth edge L4 is close to the third edge L3. Exemplarily, the distance between the third edge L3 of the first adhesive face F2 and the fourth edge L4 of the auxiliary surface F1 may be within a range of 0.5 to 1.5 mm. As such, regions on the auxiliary surface F1 for attaching the double-faced adhesive are all greater than the area of the double-faced adhesive, such that an attachment error of the double-faced adhesive may be reduced.

Figure 5:
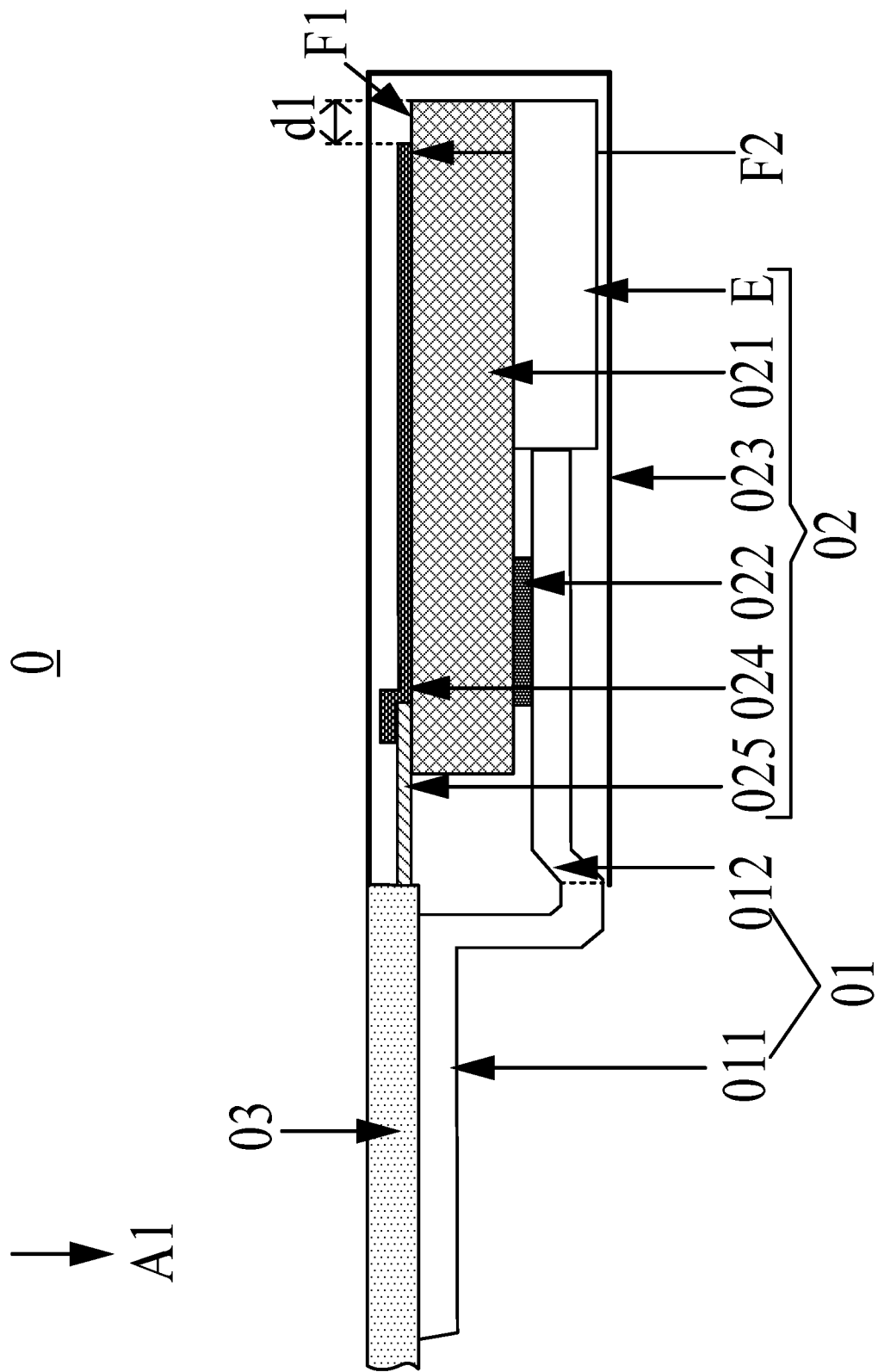
FIG. 5 is a schematic partial sectional diagram of still another display screen according to an embodiment of the present disclosure.
Figure 6:
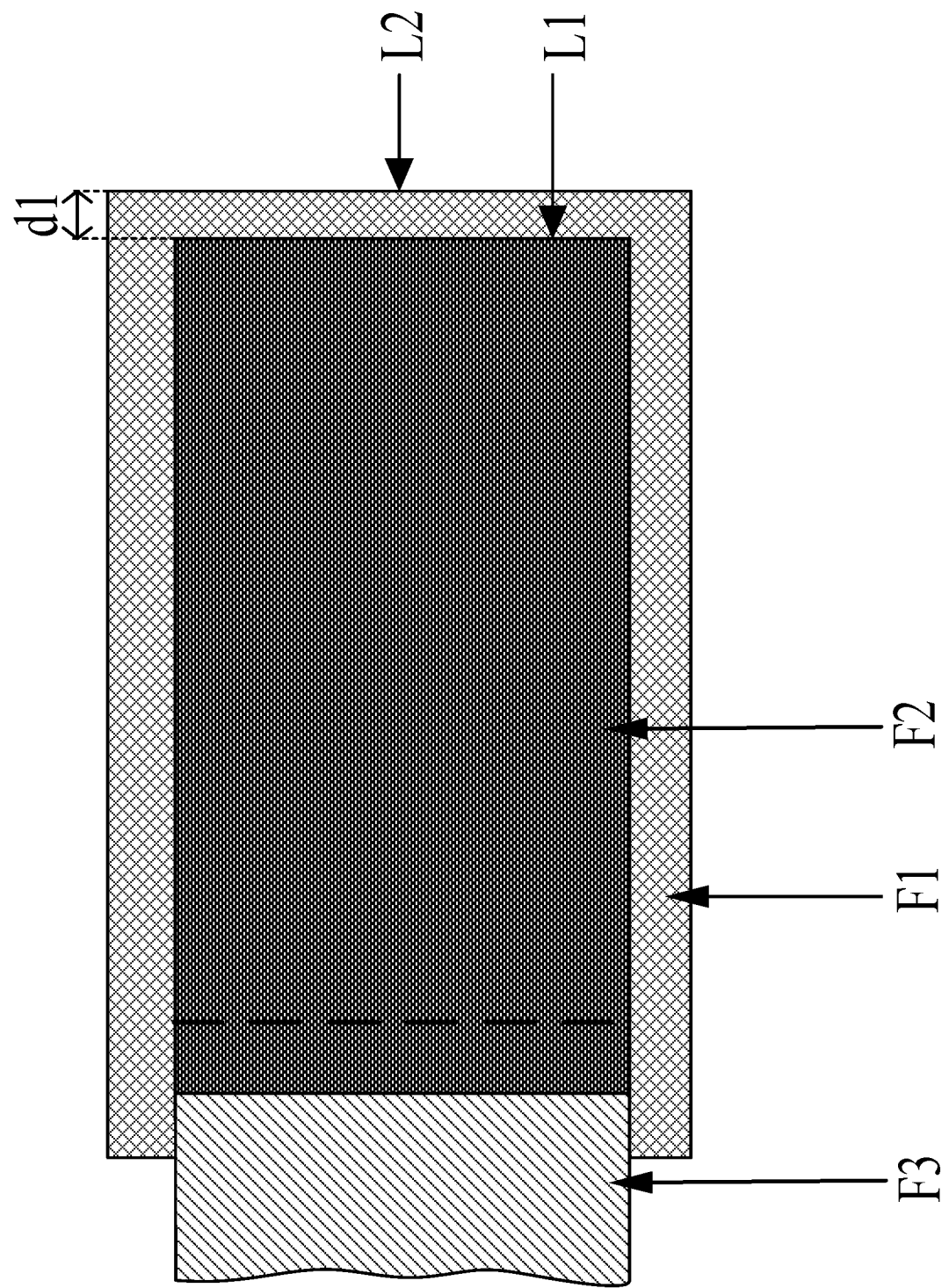
FIG. 6 is a schematic diagram of another relative relationship between an auxiliary surface, a first adhesive face and a surface of a flexible printed circuit away from a printed circuit board according to an embodiment of the present disclosure.

Optionally, FIG. 5 is a schematic partial structural diagram of still another display screen according to an embodiment of the present disclosure. As illustrated in FIG. 5, a position relationship between the flexible printed circuit 025 and the double-faced adhesive 024 may also be different from that illustrated in FIG. 3. As seen from FIG. 5, the flexible printed circuit 025 may also be between the printed circuit board 021 and the double-faced adhesive 024. That is, the first adhesive face F2 of the double-faced adhesive 024 is in contact with both the auxiliary surface F1 and the surface of the flexible printed circuit 025 away from the printed circuit board 021. For clear descriptions of the relationship between the first adhesive face F2 and the auxiliary surface F1, an embodiment of the present disclosure provides another schematic diagram illustrating the relative position relationship between the auxiliary surface F1, the first adhesive face F2 and the surface F3 of the flexible printed circuit away from the printed circuit board as illustrated in FIG. 6. As seen from FIG. 6, a distance d1 between the first edge L1 of the first adhesive face F2 of the double-faced adhesive and a second edge L2 of the auxiliary surface F1 is greater than 0, wherein the first edge L1 is any edge of the first adhesive surface F2, and the second edge L2 is close to the first edge L1. Exemplarily, the distance between the first edge L1 of the first adhesive face F2 and the second edge L2 of the auxiliary surface F1 may be within a range of 0.5 to 1.5 mm. As such, regions on the auxiliary surface F1 for attaching the double-faced adhesive are all greater than the area of the double-faced adhesive, such that an attachment error of the double-faced adhesive may be reduced.

Figure 7:
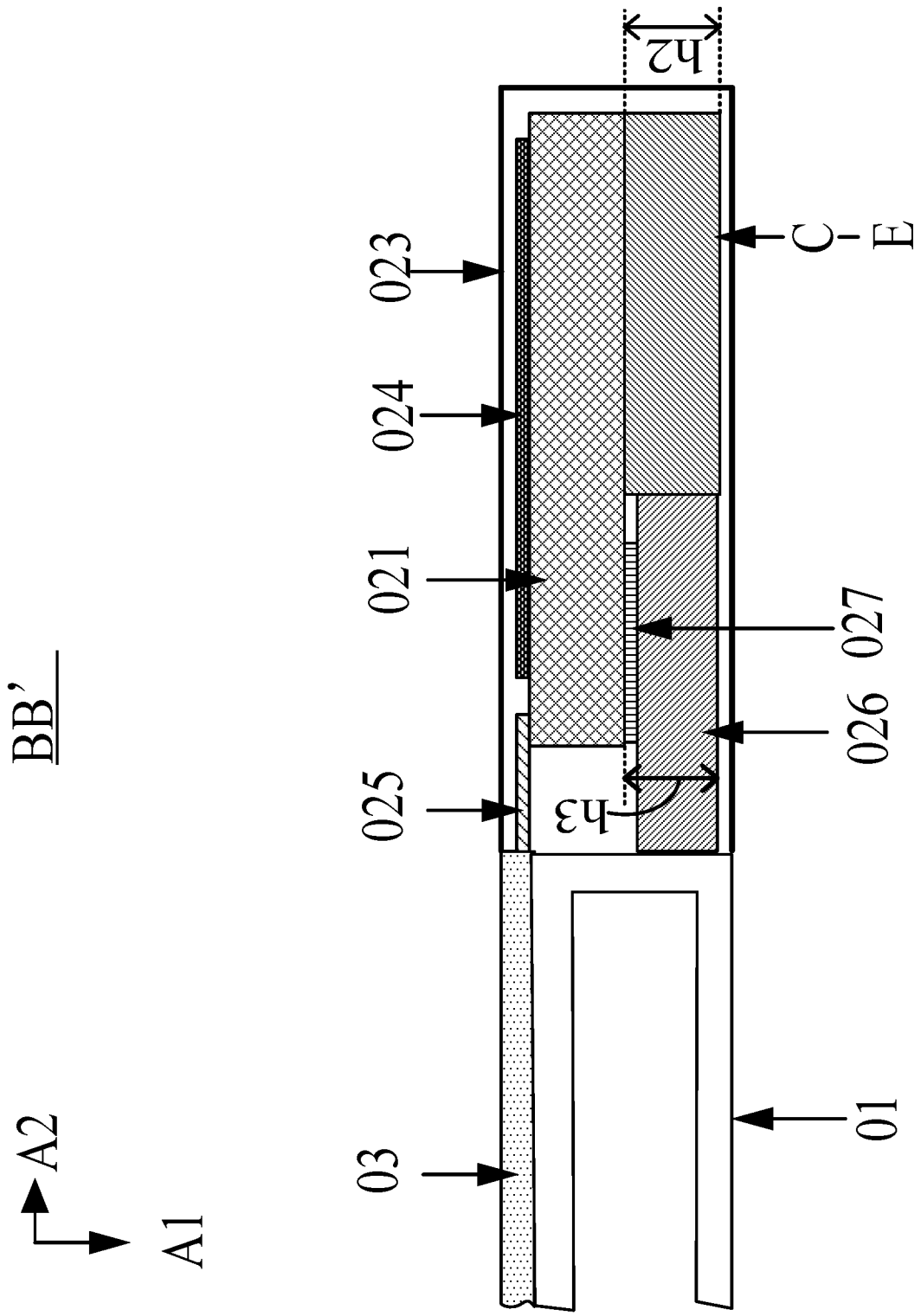
FIG. 7 is a schematic partial sectional diagram of yet still another display screen according to an embodiment of the present disclosure.
Figure 8:
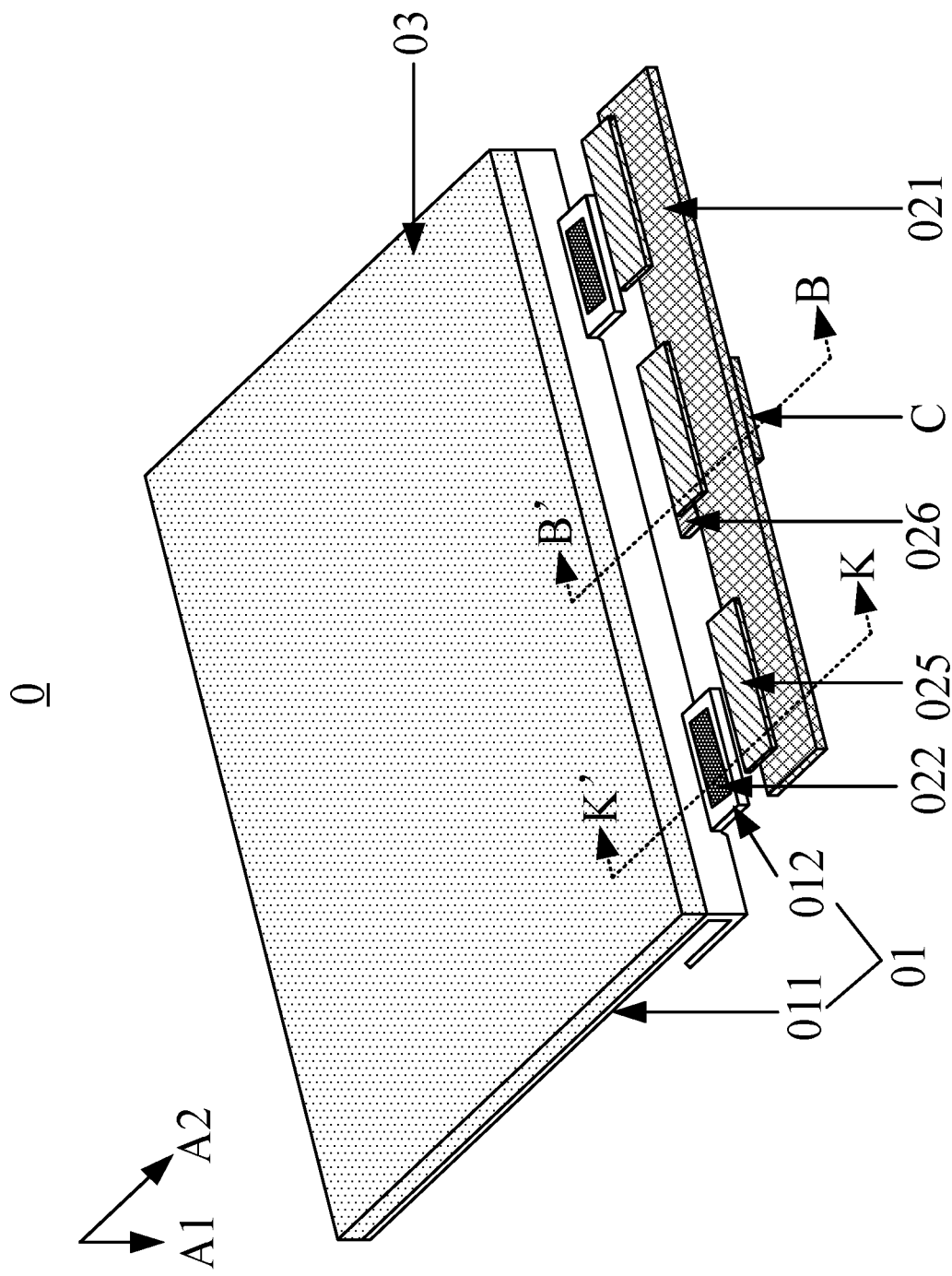
FIG. 8 is a schematic exploded diagram of a partial structure of a display screen display screen according to an embodiment of the present disclosure.

FIG. 7 is a schematic partial sectional diagram of yet still another display screen according to an embodiment of the present disclosure. The schematic partial sectional diagram in FIG. 7 is a sectional view taken along BB' of the display screen in FIG. 8. It should be noted that FIG. 3 and FIG. 5 are both sectional views taken along KK' of the display screen in FIG. 8. As illustrated in FIG. 7, the display screen 0 may further include: an abutting block 026 and an adhesive 027 (the abutting block 026 and the adhesive 027 both pertain to the circuit module); and the electronic device E may include a connector C (it should be noted that FIG. 8 does not illustrate the wrap structure and the double-faced adhesive, and for clear illustration of the abutting block 026, the circuit module in FIG. 8 is separated from the backplane). In addition, as illustrated in FIG. 7 and FIG. 8, the embodiment of the present disclosure is described using the scenario where the circuit module includes one abutting block 026 and one connector C as an example. Optionally, the circuit module may include a plurality of abutting blocks 026 and a plurality of connectors C, for example, 2 or 3, which is not limited in the embodiment of the present disclosure.

Still referring to FIG. 7, the abutting block 026 is fixed to the surface of the printed circuit board 021 close to the backplane 01 by the adhesive 027, and the abutting block 026 and the connector C are on a same side of the printed circuit board 021, and are arranged in sequence along a direction A2 away from the backplane 01. As illustrated in FIG. 7, one end of the abutting block 026 away from the connector C is abutted against the backplane 01.

Figure 9:
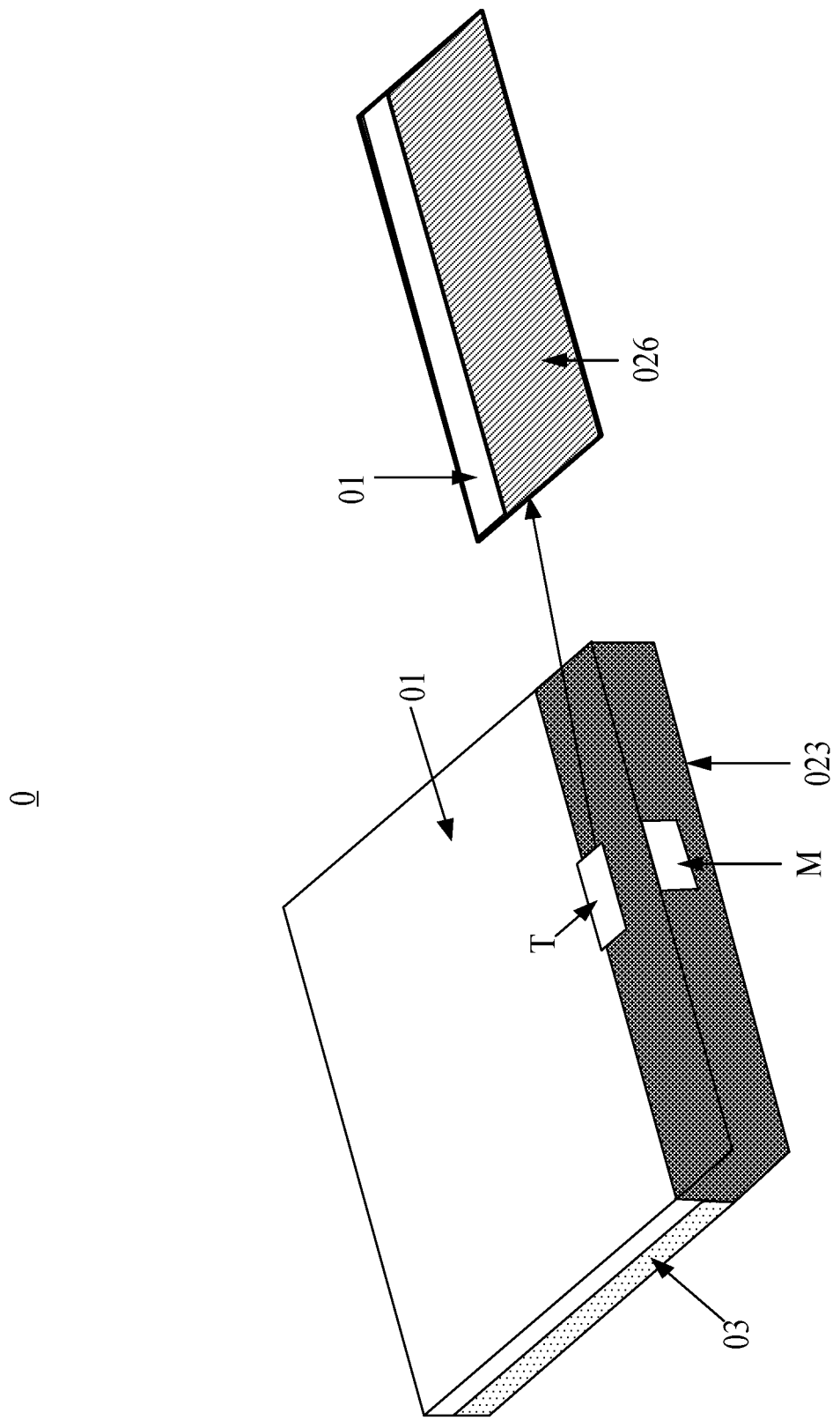
FIG. 9 is a schematic partial structural diagram of a top diagram of a display substrate according to an embodiment of the present disclosure.

Optionally, FIG. 9 is a schematic partial structural diagram of a top diagram of a display substrate according to an embodiment of the present disclosure. FIG. 9 merely illustrates the general schematic diagram of the backplane and does not show the actual structure of the backplane. As illustrated in FIG. 9, the wrap structure 023 may have an opening M for communicating with the connector, and a plug (not illustrated in FIG. 9) outside the display screen may be inserted into the connector C in FIG. 7 and FIG. 8 from the opening M. It should be noted that when the plug is inserted into the connector C, the plug may apply, through the connector C, force towards the backplane 01 onto the printed circuit board 021, such that the printed circuit board 021 tends to move towards the backplane 01. However, since the abutting block 026 is not only connected to the printed circuit board 021 but also abutted against the backplane 01, the abutting block 026 can prevent the printed circuit board 021 from moving towards the backplane 01 as the plug is inserted. In this way, stability of the circuit module is further improved, and stability of the entire display screen is enhanced.

Optionally, the abutting block 026 in FIG. 7 and FIG. 8 may be insulated from each electronic device. Therefore, the abutting block 26 may not affect normal operation of the circuit module. In addition, as illustrated in FIG. 7, in the thicknesswise direction A1 of the printed circuit board 021, a sum h3 of a thickness of the abutting block 026 and a thickness of the adhesive 027 is less than the maximum thickness h2 of the electronic device (that is, the connector). That is, the abutting block 026 may not increase the entire thickness of the circuit module. Optionally, the abutting block 026 may be made of polycarbonate (PC). When the hardness of the PC is greater than a certain value, the PC may be referred to as hard PC. This certain value may be 50 Rockwell hardness C (HRC).

Optionally, referring to FIG. 8, in the circuit module, the abutting block 026 and the connector C may be oppositely arranged in one-to-one correspondence. Since the position where the connector C is disposed on the printed circuit board 021 generally suffers from a great pushing force when the plug is inserted into the connector C along a direction opposite to the direction A2, opposite arrangement of the abutting block 026 and the connector C in one-to-one correspondence may effectively prevent the printed circuit board 021 from moving under the effect of the pushing force, such that the flexible printed circuit 025 is prevented from damage or breakage due to movement of the printed circuit board.

Optionally, still referring to FIG. 8, the display panel 03 may be fixed to the backplane body 011, the printed circuit board 021 is attached to the support bar 012 by the fixing adhesive, and one end of the abutting block 026 away from the connector C is abutted against the backplane body 011. FIG. 8 uses the scenario where the backplane 01 includes two support bars 012 as an example. Optionally, the backplane 01 may further include a plurality of support bars 012 (for example, three or four support bars), and the abutting block 026 may be disposed between the plurality of support bars 012. When the number of support bars 012 is large, the printed circuit board 021 may be effectively fixed to the backplane 01. In this case, the abutting block 026 may be disposed between the plurality of support bars 012, such that the effect of preventing the printed circuit board 021 from moving by the abutting block 026 is improved.

Optionally, referring to both FIG. 8 and FIG. 9, a target portion of the wrap structure 023 disposed on a side of the printed circuit board 021 facing towards the backplane has a transparent region T, and the transparent region T rightly faces an abutting position in the backplane 01 that is abutted against the abutting block 026 (that is, an orthographic projection of the abutting position on the target portion is within the transparent region T). Since the transparent region T in the wrap structure 023 rightly faces the abutting position in the backplane 01 that is abutted against the abutting block 026, operating personnel may observe whether the abutting block 026 is abutted against the backplane 01 through the transparent region T. Where the abutting block 026 is not abutted against the backplane 01, the operating personnel may observe and determine a specific position of the abutting block 026 through the transparent region T, and hence adjust the abutting block 026, to cause the abutting block 026 to be abutted against the backplane 01 and to ensure that the abutting block 026 effectively prevents the printed circuit board 021 from moving towards the backplane 01.

Optionally, in the circuit module, the wrap structure 023 and the abutting block 026 may be an integral structure. In this way, abutting between the abutting block 026 and the backplane 01 may be practiced by controlling the integral structure. Optionally, in the circuit module, the wrap structure 023 and the abutting block 026 may also not be an integral structure, which is not limited in the embodiment of the present disclosure.

In addition, in the thicknesswise direction A1 of the printed circuit board 021, the thickness of the circuit module (that is, the thickness of the side, where the printed circuit board 021 is, of the display screen) may be 1.99 mm, the thickness of the printed circuit board 021 may be 0.8 mm, the maximum thickness of the electronic device (that is, the connector) on the printed circuit board 021 may be 1.0 mm, the portions of the wrap structure 023 on two sides of the printed circuit board 21 have a total thickness of 0.16 mm, and the thickness of the double-faced adhesive 024 may be 0.03 mm. The thickness of the display panel 03 may be 1.7 to 2.0 mm. Therefore, the circuit module in the embodiment of the present disclosure may satisfy the requirement that the display screen is thinner when the display panel 03 of the display screen is thinner.

Still referring to FIG. 1, in the related art, the thickness of the printed circuit board 11 may be 0.8 mm, the thickness of the device or element (not illustrated in FIG. 1) on the printed circuit board 11 may be 1.0 mm, the portions of the wrap structure (not illustrated in FIG. 1) on two sides of the printed circuit board 11 have a total thickness of 0.16 mm, and the thickness of the screw cap of the screw 12 may be 0.2 mm. Therefore, in the display screen in the related art, the entire thickness (that is, the thickness of the circuit module) of the side where the printed circuit board is disposed may be 2.16 mm. It is apparent that the thickness of the circuit module according to the embodiment of the present disclosure is far less than the thickness of the circuit module in the related art.

An embodiment of the present disclosure provides a display apparatus. The display apparatus may include the display screen as illustrated in any of FIG. 2 to FIG. 9. Exemplarily, the display apparatus may be electronic paper, a mobile phone, a tablet computer, a television, a display, a laptop computer, a digital photo frame, a navigator or the like product or part having the display function.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A display screen, comprising: a backplane, a printed circuit board, a fixing adhesive, a wrap structure and a double-faced adhesive, wherein the printed circuit board is fixed to the backplane by the fixing adhesive; and
   wherein the wrap structure wraps the printed circuit board and the backplane, and the printed circuit board is fixed to the wrap structure by the double-faced adhesive.

2. The display screen according to claim 1, wherein the fixing adhesive comprises: a conductive adhesive.

3. The display screen according to claim 1, further comprising: an electronic device; wherein
   the fixing adhesive and the electronic device are both on a surface on the printed circuit board close to the backplane, and in a thicknesswise direction of the printed circuit board, a sum of a thickness of a portion of the backplane in contact with the fixing adhesive and a thickness of the fixing adhesive is less than a maximum thickness of the electronic device.

4. The display screen according to claim 1, wherein in a thicknesswise direction of the printed circuit board, a thickness of the double-faced adhesive is less than 0.2 mm.

5. The display screen according to claim 4, wherein in the thicknesswise direction of the printed circuit board, the thickness of the double-faced adhesive is 0.03 mm.

6. The display screen according to claim 1, further comprising: a display panel and a flexible circuit board; wherein
   the display panel and the printed circuit board are on a same side of the backplane, and the flexible circuit board is between the printed circuit board and the double-faced adhesive; and
   one end of the flexible printed circuit is electrically connected to the electronic device by the printed circuit board, and the other end of the flexible printed circuit is electrically connected to the display panel.

7. The display screen according to claim 6, wherein a first adhesive face of the double-faced adhesive is in contact with an auxiliary surface of the printed circuit board away from the backplane;
   wherein an orthographic projection of a first edge of the first adhesive face on a plane of the auxiliary surface is within the auxiliary surface, and a distance between the first edge and a second edge of the auxiliary surface is greater than 0, wherein the first edge is any edge of the first adhesive face, and the second edge is close to the first edge.

8. The display screen according to claim 1, further comprising: a display panel and a flexible printed circuit; wherein
   the display panel and the printed circuit board are on a same side of the backplane, the flexible printed circuit and the double-faced adhesive are on a same surface of the printed circuit board, and a gap exists between an orthographic projection of the flexible printed circuit on the printed circuit board and an orthographic projection of the double-faced adhesive on the printed circuit board; and one end of the flexible printed circuit is electrically connected to the electronic device by the printed circuit board, and the other end of the flexible printed circuit is electrically connected to the display panel.

9. The display screen according to claim 8, wherein a first adhesive face of the double-faced adhesive is in contact with an auxiliary surface of the printed circuit board away from the backplane;
wherein an orthographic projection of a third edge of the first adhesive face on a plane of the auxiliary surface is within the auxiliary surface, and a distance between the third edge and a fourth edge of the auxiliary surface is greater than 0;
wherein the third edge is any edge of the first adhesive face away from the flexible printed circuit, and the fourth edge is close to the third edge.

10. The display screen according to claim 3, further comprising: an abutting block and an adhesive; wherein the electronic device comprises a connector;
wherein the abutting block is fixed to a surface of the printed circuit board close to the backplane, and the abutting block and the connector are on a same side of the printed circuit board and are arranged in sequence along a direction away from the backplane, one end the abutting block away from the connector is abutted against the backplane, and the abutting block is insulated from the connector.

11. The display screen according to claim 10, wherein in a thicknesswise direction of the printed circuit board, a sum of a thickness of the abutting block and a thickness of the adhesive is less than a maximum thickness of the connector.

12. The display screen according to claim 10, wherein the abutting block and the connector are oppositely arranged in one-to-one correspondence in the display screen.

13. The display screen according to claim 10, wherein the backplane comprises: a backplane body, and a support bar extending from a side face of the backplane body towards the printed circuit board, the printed circuit board is fixed to the support bar by the adhesive, and one end of the abutting block away from the connector is abutted against the backplane body.

14. The display screen according to claim 13, wherein the backplane comprises a plurality of the support bars, and the abutting block is between the plurality of the support bars.

15. The display screen according to claim 10, wherein a target portion of the wrap structure on a side of the printed circuit board facing towards the backplane has a transparent region, and an orthographic projection of an abutting position between the backplane and the abutting block on the target portion is within the transparent region.

16. The display screen according to claim 10, wherein the wrap structure and the abutting block are an integral structure.

17. The display screen according to claim 1, wherein in a thicknesswise direction of the printed circuit board, a thickness of a side, where the printed circuit board is, of the display screen is 1.99 mm.

18. The display screen according to claim 3, wherein the fixing adhesive comprises: a conductive adhesive;
the display screen further comprises: a wrap structure and a double-faced adhesive, wherein the wrap structure wraps the printed circuit board and the backplane, and the printed circuit board is fixed to the wrap structure by the double-faced adhesive, in a thicknesswise direction of the printed circuit board, a thickness of the double-faced adhesive is 0.03 mm; the display screen further comprises: an abutting block and an adhesive, and the electronic device comprises a connector;
wherein the abutting block is fixed to a surface of the printed circuit board close to the backplane, and the abutting block and the connector are on a same side of the printed circuit board and are arranged in sequence along a direction away from the backplane, one end of the abutting block away from the connector is abutted against the backplane, and the abutting block is insulated from the connector; in the thicknesswise direction of the printed circuit board, a sum of a thickness of the abutting block and a thickness of the adhesive is less than a maximum thickness of the connector; the abutting block and the connector are oppositely arranged in one-to-one correspondence in the display screen; the backplane comprises: a backplane body, and a support bar extending from a side face of the backplane body towards the printed circuit board, the printed circuit board is fixed to the support bar by the adhesive, and one end of the abutting block away from the connector is abutted against the backplane body; the backplane comprises a plurality of the support bars, and the abutting block is between the plurality of the support bars; a target portion of the wrap structure on a side of the printed circuit board facing towards the backplane has a transparent region, and an orthographic projection of an abutting position between the backplane and the abutting block on the target portion is within the transparent region; the wrap structure and the abutting block are an integral structure, in the thicknesswise direction of the printed circuit board, a thickness of a side, where the printed circuit board is, of the display screen is 1.99 mm;
the display screen satisfies one of the following conditions:
the display screen further comprises: a display panel and a flexible printed circuit; wherein the display panel and the printed circuit board are on a same side of the backplane, and the flexible printed circuit is between the printed circuit board and the double-faced adhesive, and one end of the flexible printed circuit is electrically connected to the electronic device by the printed circuit board, and the other end of the flexible printed circuit is electrically connected to the display panel, a first adhesive face of the double-faced adhesive is in contact with an auxiliary surface of the printed circuit board away from the backplane, wherein an orthographic projection of a first edge of the first adhesive face on a plane of the auxiliary surface is within the auxiliary surface, and a distance between the first edge and a second edge of the auxiliary surface is greater than 0, wherein the first edge is any edge of the first adhesive face, and the second edge is close to the first edge;
the display screen further comprises: a display panel and a flexible printed circuit; wherein the display panel and the printed circuit board are on a same side of the backplane, the flexible printed circuit and the double-faced adhesive are disposed on a same surface of the printed circuit board, and a gap exists between an orthographic projection of the flexible printed circuit on the printed circuit board and an orthographic projection of the double-faced adhesive on the printed circuit board; and one end of the flexible printed circuit is electrically connected to the electronic device by the printed circuit board, and the other end of the flexible printed circuit is electrically connected to the display panel, a first adhesive face of the double-faced adhesive is in contact with an auxiliary surface of the printed circuit board away from the backplane, wherein an orthographic projection of a third edge of the first adhesive face on a plane of the auxiliary surface is within the auxiliary surface, and a distance between the third edge and a fourth edge of the auxiliary surface is greater than 0, wherein the third edge is any edge of the first adhesive face away from the flexible printed circuit, and the fourth edge is close to the third edge.

19. A display apparatus, comprising a display screen, wherein the display screen comprises: a backplane, a printed circuit board, a fixing adhesive, a wrap structure and a double-faced adhesive, wherein the printed circuit board is fixed to the backplane by the fixing adhesive; and wherein the wrap structure wraps the printed circuit board and the backplane, and the printed circuit board is fixed to the wrap structure by the double-faced adhesive.

* * * * *